United States Patent
Bienert et al.

(10) Patent No.: US 10,055,613 B1
(45) Date of Patent: Aug. 21, 2018

(54) NFC READER WITH AUTO TUNER

(71) Applicant: NXP B.V., Eindhoven (NL)

(72) Inventors: Renke Bienert, Handeloh (DE); Tim Griesshammer, Hamburg (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/425,105

(22) Filed: Feb. 6, 2017

(51) Int. Cl.
G06K 19/06 (2006.01)
G06K 7/00 (2006.01)
H01Q 1/22 (2006.01)
H03H 7/01 (2006.01)
G06K 19/07 (2006.01)

(52) U.S. Cl.
CPC ....... G06K 7/0008 (2013.01); G06K 19/0726 (2013.01); H01Q 1/2216 (2013.01); H03H 7/0115 (2013.01)

(58) Field of Classification Search
CPC ............. G06K 7/0008; G06K 19/0726; H01Q 1/2216; H03H 7/0115
USPC ................................................ 235/492, 487
See application file for complete search history.

(56) References Cited

U.S. PATENT DOCUMENTS

| | | | |
|---|---|---|---|
| 6,560,299 B1 | 5/2003 | Strolle et al. | |
| 8,314,653 B1 | 11/2012 | Granger et al. | |
| 9,236,771 B2* | 1/2016 | Toncich | G06K 7/0008 |
| 9,240,811 B2 | 1/2016 | Norholm | |
| 9,319,208 B2 | 4/2016 | Khlat | |
| 9,654,181 B1 | 5/2017 | Wobak et al. | |
| 9,893,715 B2 | 2/2018 | Zachara | |
| 2007/0045418 A1 | 3/2007 | Charrat et al. | |
| 2009/0243397 A1 | 10/2009 | Cook et al. | |
| 2009/0280753 A1 | 11/2009 | Philip et al. | |
| 2009/0284220 A1* | 11/2009 | Toncich | G06K 7/0008 320/108 |
| 2010/0321128 A1 | 12/2010 | Merlin | |
| 2010/0323635 A1 | 12/2010 | Steeper et al. | |
| 2013/0009722 A1* | 1/2013 | White | H03H 7/40 333/17.3 |
| 2013/0109305 A1 | 5/2013 | Savoj et al. | |
| 2014/0285286 A1 | 9/2014 | Bojer | |
| 2015/0054345 A1 | 2/2015 | Monat et al. | |
| 2015/0070233 A1 | 3/2015 | Nakamura et al. | |
| 2016/0242124 A1 | 8/2016 | Zhou et al. | |
| 2016/0292560 A1 | 10/2016 | Ayatollahi et al. | |
| 2016/0293025 A1 | 10/2016 | Marr et al. | |

(Continued)

FOREIGN PATENT DOCUMENTS

JP 2014 230049 A 12/2014

OTHER PUBLICATIONS

Non Final Office Action dated Mar. 8, 2018 for U.S. Appl. No. 15/466,137 6 pages.

(Continued)

*Primary Examiner* — Paultep Savusdiphol
(74) *Attorney, Agent, or Firm* — Rajeev Madnawat

(57) ABSTRACT

A near field communication (NFC) reader is disclosed. The NFC reader includes a NFC controller, an antenna, a filter coupled to the NFC controller, a tuner coupled to the antenna and a dynamic power control unit coupled between the filter and the tuner. The dynamic power control unit includes a voltage controlled capacitor and a direct current (DC) part extraction circuit coupled to the voltage controlled capacitor.

8 Claims, 1 Drawing Sheet

(56) References Cited

U.S. PATENT DOCUMENTS

2016/0329638 A1 11/2016 Kanno
2017/0104468 A1 4/2017 Korman et al.

OTHER PUBLICATIONS

Final Office Action dated May 23, 2018 for U.S. Appl. No. 15/466,137 7 pages.

* cited by examiner

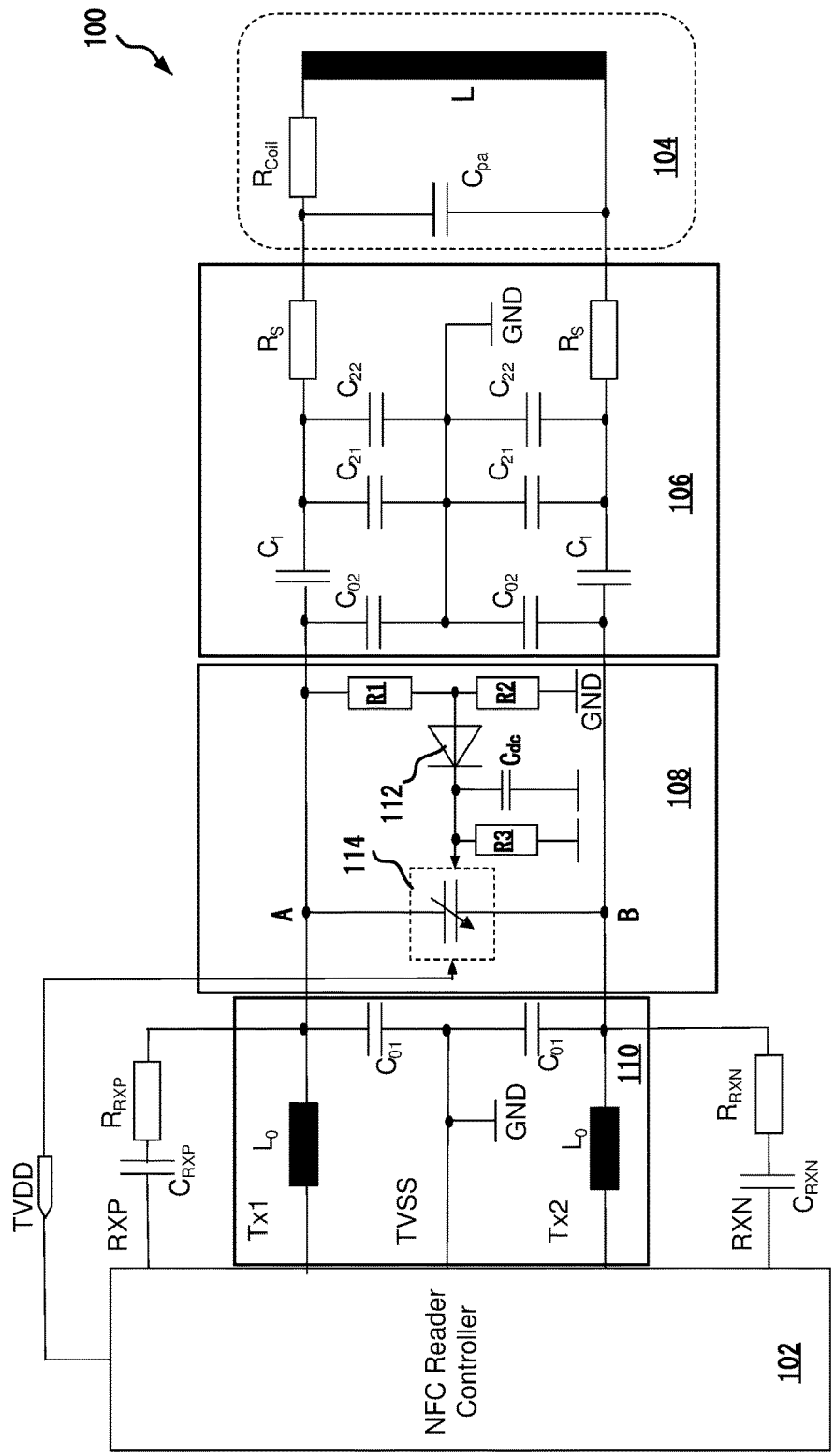

NFC READER WITH AUTO TUNER

BACKGROUND

Wireless communication technologies, such as those used for NFC or ISO/IEC 14443 devices, communicate with each other via magnetic field induction in close distance. Each device features an antenna. The primary device ("reader" or "initiator") generates the magnetic field which can be used to power secondary devices like passive transponders. Modulation schemes applied to the magnetic fields are used for communication purpose between the devices.

The primary device uses a transmitter to generate the emitted radio frequency (RF) field. A matching circuitry is used to transform and adapt the antenna impedance to the emitting device's transmitter. A low ohmic matching impedance is generally used for increased power transmission.

One limiting factor of the operating volume size is the emitted RF power of the primary device. Applications like contact-less payment systems require a specific operating distance. As the primary device's antenna size is often a constraint to the product, high output power transmitters are required.

The primary and secondary devices form a coupled wireless resonant circuit. If the coupling between the components is increased, the primary resonant circuit will be loaded and detuned. This results in a different load impedance seen by the primary device's transmitter, possibly causing an increased driver current and increased RF field emission. Regulatory bodies and RF standards limit the maximum allowed emitted RF power. Therefore, incompliance of the application system can occur in case of detuning. Furthermore, increased current consumption can be linked to device damage and reduced user experience in case of battery powered devices.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, a near field communication (NFC) reader is disclosed. The NFC reader includes an NFC controller, an antenna, a filter coupled to the NFC controller, a tuner coupled to the antenna and a dynamic power control unit coupled between the filter and the tuner. The dynamic power control unit includes a voltage controlled capacitor and a direct current (DC) part extraction circuit coupled to the voltage controlled capacitor.

In some embodiments, the filter is an electromagnetic compatibility (EMC) low pass filter having a symmetrical component structure coupled to two transmission lines coupled to the NFC controller. The DC part extraction circuit is coupled to a transmitter line on one side and the voltage controlled capacitor on the other side. The DC part extraction circuit includes a diode, a capacitor and a resistor. An output of the DC part extraction circuit is biased with a supply voltage of the NFC controller. The dynamic power control unit is configured such that a higher value of a DC voltage at an output of the DC part extraction circuit reduces a capacitance of the voltage controlled capacitor. The dynamic power control unit is configured to tune the NFC reader in symmetrical tuning under normal load conditions and in asymmetrical tuning under increased load conditions such that an impedance of the antenna remains above a preselected threshold. The voltage controlled capacitor is coupled to the filter such than when a capacitance of the voltage controlled capacitor increases, a capacitance of the filter increases by a same amount.

The terms "symmetrical tuning" and "asymmetrical tuning" as used herein refer to the representation of the variations in impedance on a smith chart. A different EMC filter cut-off frequency may cause the antenna impedance curve to be represented either symmetrically or asymmetrically on capacitive and inductive sides on a smith chart.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. Advantages of the subject matter claimed will become apparent to those skilled in the art upon reading this description in conjunction with the accompanying drawings, in which like reference numerals have been used to designate like elements, and in which:

FIG. 1 depicts a schematic circuit diagram of a near field communication (NFC) reader with dynamic power control in accordance with one or more embodiments of the present disclosure;

Note that FIGURES are not drawn to scale. Intermediate steps between FIGURE transitions have been omitted so as not to obfuscate the disclosure. Those intermediate steps are known to a person skilled in the art.

DETAILED DESCRIPTION

Many well-known manufacturing steps, components, and connectors have been omitted or not described in details in the description so as not to obfuscate the present disclosure.

FIG. 1 depicts a schematic circuit diagram of a near field communication (NFC) reader 100. The NFC reader 100 includes a NFC reader controller 102 and an antenna tuning circuit that includes an electromagnetic compatibility (EMC) low pass filter 110, a tuner (includes tuning circuitry) 106, an antenna circuit 104 including a coil L. The antenna circuit 104 may also include a resistor $R_{coil}$ and a capacitor $C_{pa}$. Note however that the resistor $R_{coil}$ and the capacitor $C_{pa}$ may not be independent components in that the capacitor $C_{pa}$ may be representing internal resistance and capacitance of the coil L. The NFC reader 100 also includes a dynamic power controller 108.

The EMC low pass filter 110 is typically a second order low pass filter that includes two inductors L0 and two capacitors C0 (build with C0=C01+C02). The tuning itself is done with two serial capacitors C1 and two parallel capacitors C2 (build with C2=C21+C22). Two damping resistors Rs may be included to adjust the Q-factor of the antenna circuit 104. It may be noted that in this embodiment, a balanced circuitry is being used to increase the transmission power and to reduce radiations. The symmetrical circuitry includes two transmitter lines Tx1 and Tx2 and two receiver lines RXP and RXN that includes capacitors $C_{RXP}$ and $C_{RXN}$ and resistors $R_{RXP}$ and $R_{RXN}$. However, the embodiments described herein may also be application to un-balanced transmitter circuitry.

The antenna circuit 104 may be tuned in an asymmetric tuning or symmetric tuning. The asymmetric tuning uses the EMC filter 110 with a cut-off frequency typically in the range of 17-21 MHz. For standard NFC applications, the NFC reader antenna is tuned to an impedance of 17-30Ω. Accordingly, the field current at TVDD=5V is approximately in the range of 100-200 mA. The antenna 104 impedance increases when the antenna 104 is loaded either with an NFC card or a smartphone. The stronger the coupling between the NFC card or the smartphone with an NFC component and the antenna 104, the higher the antenna impedance and the lower the output power. This loading prevents the power consumption from exceeding the power consumption limitation of the NFC controller 102 and limits the power transfer level in low operating distance to stay within the EMVCo, NFC and ISO/IEC14443 specifications.

The symmetric tuning includes the use of the EMC filter 110 with a cut-off frequency typically in the range of 14.3-14.7 MHz. The symmetric tuning also matches the antenna 104 to the impedance typically in the range of 17-30Ω which causes a field current typically in the range of 100-200 mA.

The symmetric tuning with a lower EMC cut-off frequency has an advantage in the power transfer range due to the improved transfer function of this type of tuning. With the symmetric tuning a higher Q-factor can be used, and the field strength can be typically up to 25% higher with the same input power.

In case of the antenna detuning (e.g., due to load coupling), the symmetric antenna tuning behaves differently from the asymmetric tuning. During the loading, the impedance of the antenna circuit 104 may decrease down to even less than 5Ω. This drop in impedance increases the field strength as well as the power consumption of the NFC reader controller 102, and might easily exceed the given limits as defined in the EMVCo, NFC and ISO/IEC14443 specifications.

The embodiments described herein combine the advantages of the asymmetric tuning and the symmetric tuning in that a symmetric tuning is used under normal loading conditions and the asymmetric tuning is used when the load of the antenna 104 increases. The symmetrical/asymmetric tuning is performed by the dynamic power control unit 108. The dynamic power control unit 108 includes a voltage controlled capacitor 114 and the voltage controlled capacitor 114 can change the symmetric tuning into a asymmetric tuning when its capacitance is reduced. The capacitance of the voltage controlled capacitor 114 adds capacitance to the capacitor C0.

$$f_{cutoff} = \frac{1}{2\pi\sqrt{L_0 * C_0}}$$

As evident from the above equation, when the value of the capacitor C0 is decreased under loading conditions, the EMC cut-off frequency increases. This higher cut-off frequency automatically compensates the effect of loading in a way as described in the description of the asymmetric tuning. When the antenna 104 is detuned due to loading, the transmitter voltage increases and that voltage increase cause the value C0 to decrease due to decrease of the capacitance of the voltage controlled capacitor 114.

The dynamic power control unit 108 includes a plurality of resistors R1, R2, R3, a capacitor $C_{dc}$ and a diode 112. Note that the depicted circuit is shown as an example only. A person skilled in the art would realize that the circuit of the dynamic control unit 108 is obtaining direct current (DC) part of the transmitter voltage and inputting the extracted DC part to the voltage controlled capacitor 114. On the other side, the supply voltage TVDD is inputted to provide a bias to the extracted DC voltage. In some embodiments, the extracted DC voltage is subtracted from TVDD so that a higher extracted DC voltage reduces the capacitance of the voltage controlled capacitor 114 and thus in turn the capacitance (C0) of the EMC filter 110. As such, when the extracted DC voltage is increased, the capacitance between point A and B is decreased. Typically, the decrease in capacitance curve to the extracted DC voltage is linear.

Some or all of these embodiments may be combined, some may be omitted altogether, and additional process steps can be added while still achieving the products described herein. Thus, the subject matter described herein can be embodied in many different variations, and all such variations are contemplated to be within the scope of what is claimed.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. A near field communication (NFC) reader, comprising:
   an NFC controller;
   an antenna;
   a filter coupled to the NFC controller;
   a tuner coupled to the antenna; and
   a dynamic power control unit coupled between the filter and the tuner, wherein the dynamic power control unit includes a voltage controlled capacitor and a direct current (DC) part extraction circuit coupled to the voltage controlled capacitor.

2. The NFC reader of claim 1, wherein the filter is an electromagnetic compatibility (EMC) low pass filter having a symmetrical component structure coupled to two transmission lines coupled to the NFC controller.

3. The NFC reader of claim 1, wherein the DC part extraction circuit is coupled to a transmitter line on one side and the voltage controlled capacitor on the other side.

4. The NFC reader of claim 3, wherein the DC part extraction circuit includes a diode, a capacitor and a resistor.

5. The NFC reader of claim 4, wherein an output of the DC part extraction circuit is biased with a supply voltage of the NFC controller.

6. The NFC reader of claim 1, wherein the dynamic power control unit is configured such that a higher value of a DC voltage at an output of the DC part extraction circuit reduces a capacitance of the voltage controlled capacitor.

7. The NFC reader of claim 1, wherein the dynamic power control unit is configured to tune the NFC reader in symmetrical tuning under normal load conditions and in asymmetrical tuning under increased load conditions such that an impedance of the antenna remains above a preselected threshold.

8. The NFC reader of claim 1, wherein the voltage controlled capacitor is coupled to the filter such than when a capacitance of the voltage controlled capacitor increases, a capacitance of the filter increases by a same amount.

* * * * *